(12) United States Patent
Anderson et al.

(10) Patent No.: US 7,084,461 B2
(45) Date of Patent: Aug. 1, 2006

(54) BACK GATE FINFET SRAM

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/709,998

(22) Filed: Jun. 11, 2004

(65) Prior Publication Data

US 2005/0275040 A1  Dec. 15, 2005

(51) Int. Cl.
*H01L 31/0392* (2006.01)

(52) U.S. Cl. .................... 257/347; 257/351; 257/903

(58) Field of Classification Search ................ 257/347
See application file for complete search history.

(56) References Cited

U.S. PATENT DOCUMENTS

| | | |
|---|---|---|
| 6,391,782 B1 | 5/2002 | Yu |
| 6,413,802 B1 * | 7/2002 | Hu et al. .................... 438/151 |
| 6,433,609 B1 | 8/2002 | Voldman |
| 6,458,662 B1 | 10/2002 | Yu |
| 6,583,649 B1 | 6/2003 | Fried et al. |
| 6,611,029 B1 | 8/2003 | Ahmed et al. |
| 6,924,560 B1 * | 8/2005 | Wang et al. ................. 257/379 |
| 2003/0085424 A1 | 5/2003 | Bryant et al. |
| 2003/0141525 A1 | 7/2003 | Nowak |
| 2003/0151077 A1 | 8/2003 | Mathew et al. |
| 2005/0094434 A1 * | 5/2005 | Watanabe et al. ........... 365/156 |
| 2005/0224878 A1 * | 10/2005 | Chang ........................ 257/347 |

* cited by examiner

*Primary Examiner*—David Nelms
*Assistant Examiner*—Dao H. Nguyen
(74) *Attorney, Agent, or Firm*—Schmeiser, Olsen & Watts; William D. Sabo

(57) ABSTRACT

A compact semiconductor structure having back gate(s) for controlling threshold voltages and associated method of formation is disclosed. Fabrication of the semiconductor structure starts with a semiconductor region formed directly on an underlying electrically isolating layer. Then, a mandrel and a spacer are formed on the semiconductor region. Next, a back gate region is formed separated from the semiconductor region by a back gate isolating layer and covered by an inter-gate isolating layer. Next, a portion of the semiconductor region beneath the mandrel is removed so as to form an active region adjacent to the removed portion of the semiconductor region. Finally, a main gate region is formed in place of the removed portion of the semiconductor region and on the inter-gate isolating layer. The main gate region is separated from the active region by a main gate isolating layer and separated from the back gate region by the inter-gate isolating layer.

8 Claims, 3 Drawing Sheets

BACK GATE FINFET SRAM

BACKGROUND OF INVENTION

1. Technical Field

The present invention relates to back gate transistors, and more particularly, to back gate transistors fabricated using FinFET technologies.

2. Related Art

Dopant fluctuations are becoming a serious problem in Vt (threshold voltage) control in advanced semiconductor devices. As semiconductor devices become smaller and smaller, Vt control becomes more difficult. A known solution is to use back gates in the semiconductor devices to control Vt. One serious problem with this solution is that the use of back gates in semiconductor devices results in increased layout complexity, and therefore, higher cost.

Therefore, there is a need for a novel semiconductor structure in which back gates are formed with relatively less layout complexity. Also, there is a need for a method for forming the novel semiconductor structure. In addition, there is always a need to increase the device density of the novel semiconductor structure.

SUMMARY OF INVENTION

The present invention provides a semiconductor structure, comprising (a) a semiconductor substrate; and (b) N substructures on the substrate, N being a positive integer, each of the N substructures comprising (i) first and second FinFET active regions, wherein the first FinFET active region includes at least first and second devices, and (ii) a back gate region abutting and being sandwiched between the first and second FinFET active regions, wherein the back gate region is shared by the first and second devices.

The present invention also provides a method for forming a semiconductor structure, the method comprising the steps of (a) providing a semiconductor region directly on an underlying electrically isolating layer, the semiconductor region being covered on top by a mandrel and a spacer; (b) forming a back gate region separated from the semiconductor region by a back gate isolating layer and covered by an inter-gate isolating layer; (c) removing a portion of the semiconductor region beneath the mandrel so as to form an active region adjacent to the removed portion of the semiconductor region; and (d) forming a main gate region in place of the removed portion of the semiconductor region and on the inter-gate isolating layer, the main gate region being separated from the active region by a main gate isolating layer and being separated from the back gate region by the inter-gate isolating layer.

The present invention also provides a method for forming a semiconductor structure, the method comprising (a) providing a substrate with an isolating layer including a semiconductor layer directly on top of an underlying electrically isolating layer; (b) forming a mandrel and first and second spacers on top of the semiconductor layer, the mandrel being sandwiched between the first and second spacers; (c) etching portions of the semiconductor layer not covered by the mandrel and the first and second spacers; (d) forming a back gate isolating layer on exposed surfaces of the semiconductor layer; (e) depositing a gate material on the structure and planarizing a top surface of the structure such that the mandrel is exposed; (f) selectively forming an inter-gate insulating layer on the gate material such that the mandrel is still exposed to the atmosphere; (g) removing the mandrel; (h) etching the semiconductor layer under the removed mandrel so as to form first and second active regions being aligned with the first and second spacers, respectively; (i) forming a dielectric layer on exposed surfaces of the gate material; and (j) depositing the gate material on the structure so as to form a main gate region.

DETAILED DESCRIPTION

Figure 1A:
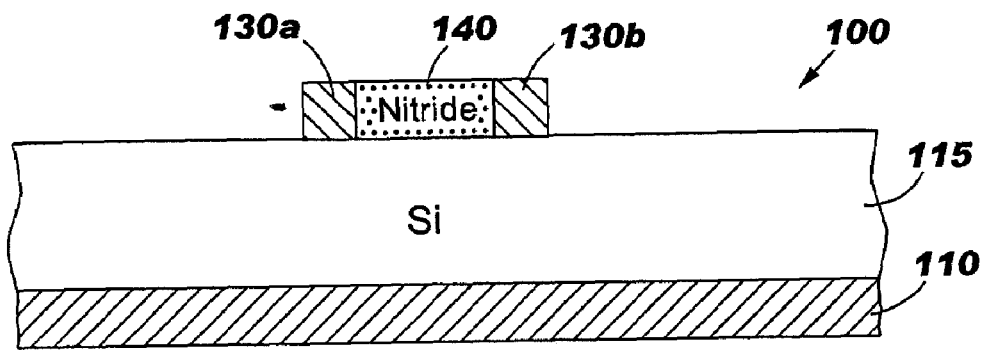
FIGS. 1A–1F illustrate a semiconductor structure after each of a series of fabrication steps, in accordance with embodiments of the present invention.

FIGS. 1A–1F illustrate a semiconductor structure 100 after each of a series of fabrication steps, in accordance with embodiments of the present invention. FIG. 1A illustrates the structure 100 after a mandrel 140 and spacers 130a and 130b are formed on an SOI (Substrate On Isolation) wafer 110,115. In one embodiment, the SOI wafer 110,115 may comprise an underlying electrically isolating layer 110 (e.g., a buried oxide layer), a silicon (Si) layer 115 directly on top of the underlying electrically isolating layer 110, and a silicon substrate (not shown for simplicity) below the electrically isolating layer 110. In one embodiment, the spacers 130a and 130b can comprise silicon dioxide ($SiO_2$). The mandrel 140 can comprise silicon nitride. The mandrel 140 and the spacers 130a and 130b are used to protect the portion of the Si layer 115 beneath it during later fabrication steps. In addition, the spacers 130a and 130b are used to define two active regions in the Si layer 115 (described infra).

Figure 1B:
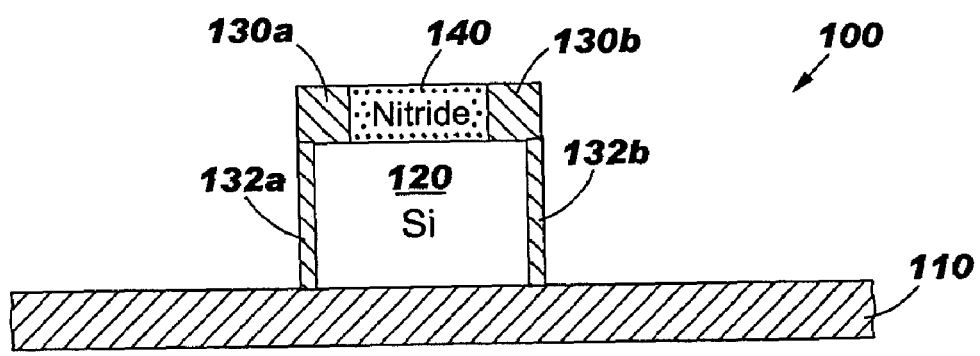

FIG. 1B illustrates the structure 100 after an etching step followed by a thermal oxidation step are performed on the structure 100 of FIG. 1A, in accordance with embodiments of the present invention. More specifically, during the etching step, portions of the Si layer 115 not protected by the mandrel 140 and the spacers 130a and 130b are etched away. As a result, the Si layer 115 (FIG. 1A) is reduced to the Si region 120 (FIG. 1B). In the ensuing thermal oxidation step, some Si material of the Si region 120 exposed to the atmosphere reacts with oxygen at high temperatures to form back gate isolating layers 132a and 132b.

Figure 1C:
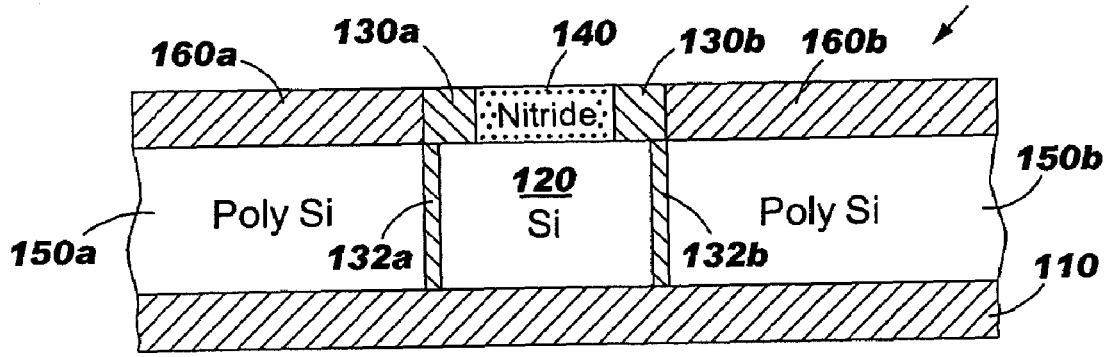
Figure 2:
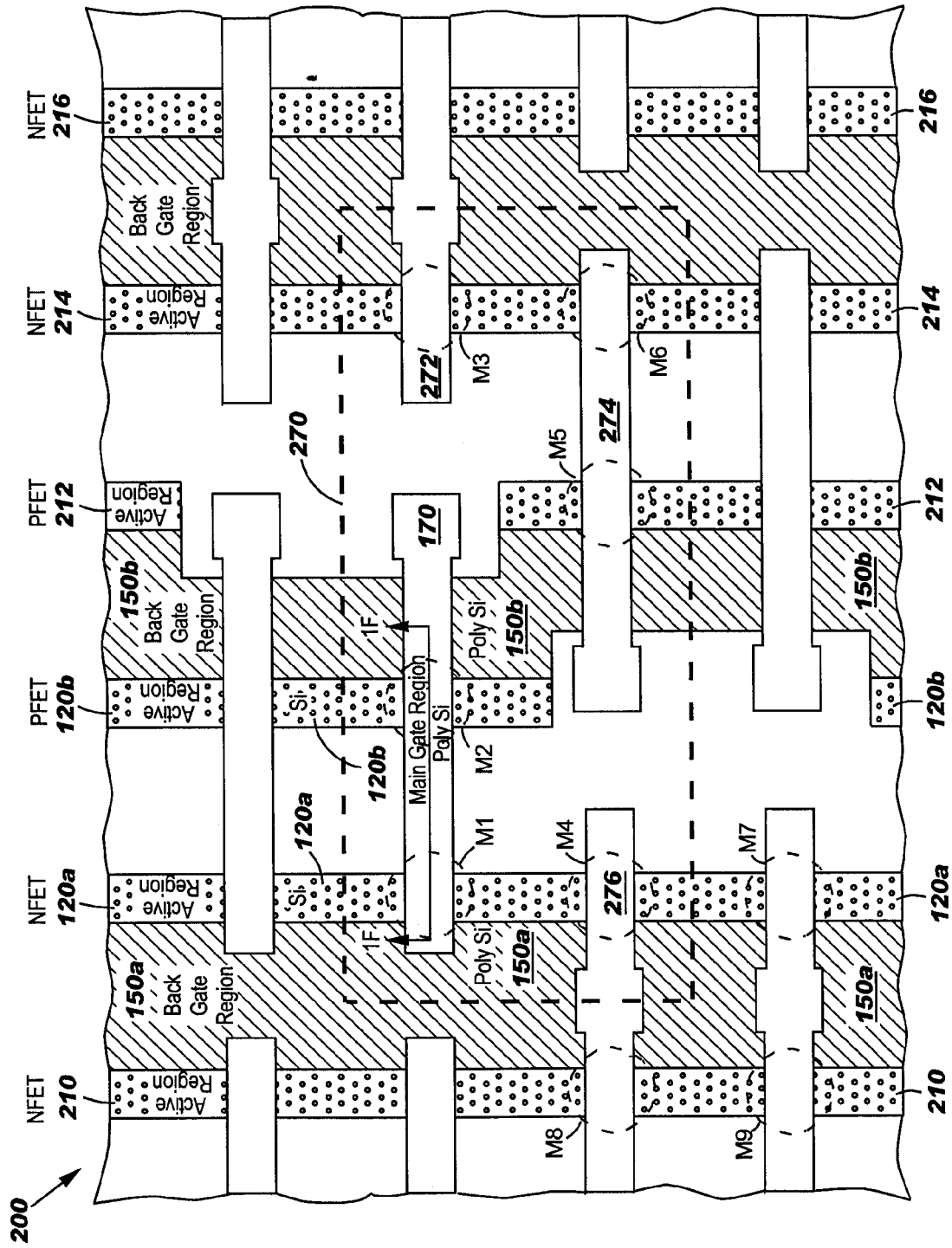
FIG. 2 illustrates a top view of another semiconductor structure that utilizes the semiconductor structure of FIG. 1F.

FIG. 1C illustrates the structure 100 after a back gate deposition step followed by a planarization step, and then a thermal oxidation step are performed on the structure 100 of FIG. 1B, in accordance with embodiments of the present invention. More specifically, in the back gate deposition step, a layer (not shown) of a gate material (such as poly-silicon) is deposited upon the entire structure 100 of FIG. 1B. Then, the top surface of the structure 100 is planarized such that the mandrel 140 is again exposed to the atmosphere. A surface where fabrication steps are directed is called a top surface. At this time, the layer of the gate material is reduced to regions 150a, 150b, 160a, and 160b (wherein regions 150a and 150b are also shown in FIG. 2). Then, in the thermal oxidation step, some Si material of the layer 150a,150b,160a,160b of the gate material exposed to the atmosphere reacts with oxygen at high temperatures to form inter-gate isolating layers 160a and 160b. Hereafter, the poly-silicon regions 150a and 150b are referred to as the back gate regions 150a and 150b, respectively.

Figure 1D:
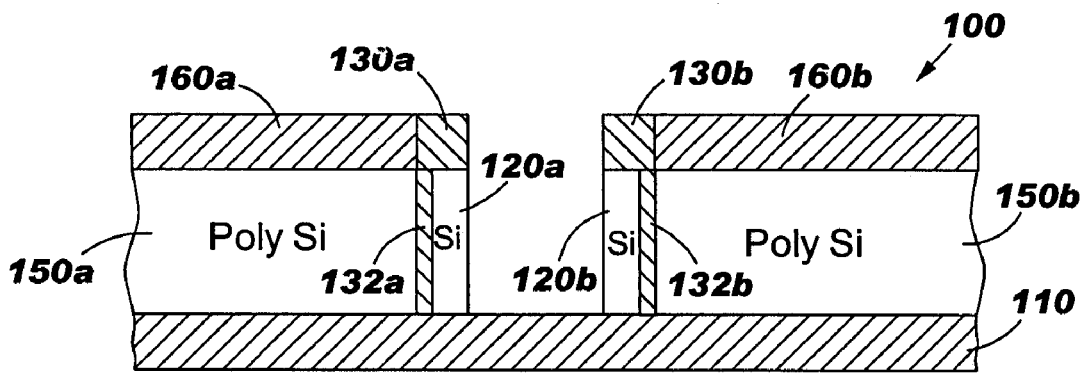

FIG. 1D illustrates the structure 100 after the mandrel 140 and a portion of the Si region 120 are removed from the structure 100 of FIG. 1C, in accordance with embodiments of the present invention. More specifically, first, the mandrel 140 can be etched away by, illustratively, chemical dip or Reactive Ion Etching (RIE). Then, the portion of the Si region 120 beneath the removed mandrel 140 is etched away, such as by RIE etching, typically using halogen-based chemistries. In this fabrication step, the spacers 130*a* and 130*b* are used as spacers to define the Si regions 120*a* and 120*b*, respectively. Hereafter, the Si regions 120*a* and 120*b* are referred to as the FinFET active regions 120*a* and 120*b*, respectively.

Figure 1E:
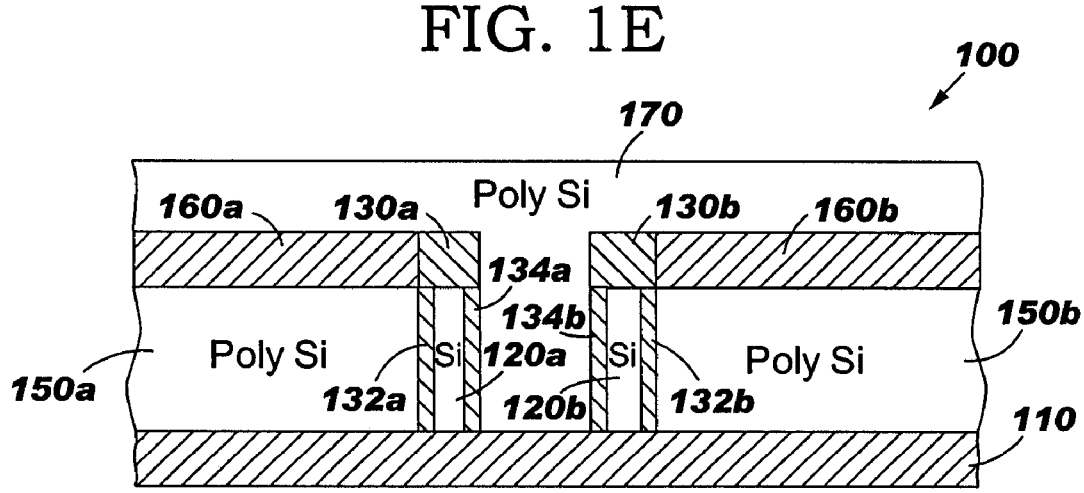

FIG. 1E illustrates the structure 100 after a thermal oxidation step followed by a main gate deposition step are performed on the structure 100 of FIG. 1D, in accordance with embodiments of the present invention. More specifically, in the thermal oxidation step, some Si material of the FinFET active regions 120*a* and 120*b* exposed to the atmosphere reacts with oxygen at high temperatures to form $SiO_2$ regions 134*a* and 134*b*, respectively. Hereafter, the $SiO_2$ regions 134*a* and 134*b* are referred to as the main gate isolating layers 134*a* and 134*b*, respectively. Then, in the main gate deposition step, a layer 170 of a gate material (such as poly-silicon) is deposited upon the entire structure 100. Then, a portion of the layer 170 is removed so as to form the main gate region 170 as shown in FIG. 1F.

During the fabrication steps described above, dopants can be introduced so that the resulting FinFET active regions 120*a* and 120*b* can comprise different transistors or devices. The structure 100 of FIG. 1F may contain multiple FinFETs (Fin Field Effect Transistors). Because the FinFET active regions 120*a* and 120*b* occupy little area on a wafer, the structure 100 has a relatively high device density.

Figure 1F:
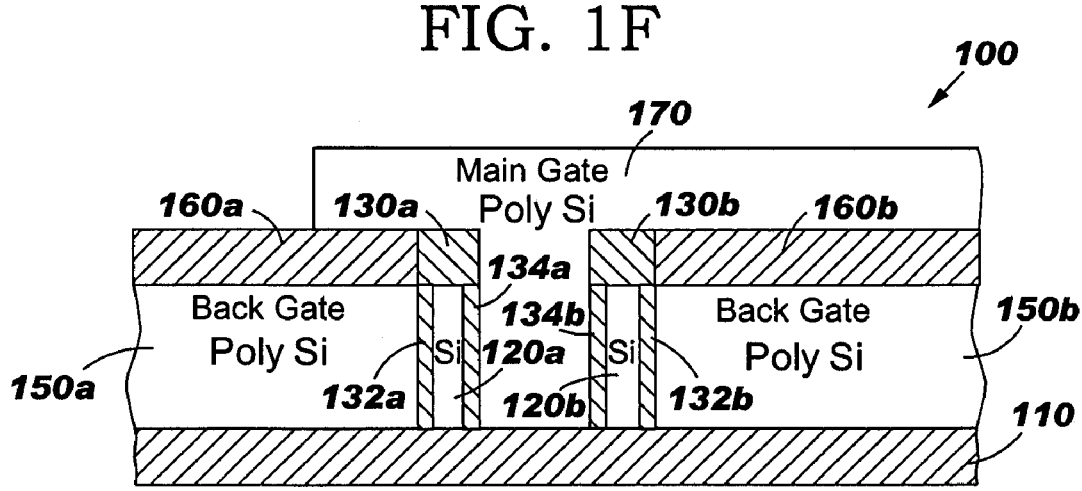

FIG. 2 illustrates a top view of a semiconductor structure 200 that utilizes the semiconductor structure 100 of FIG. 1F. More specifically, FIG. 1F illustrates a cross sectional view along the line 1F—1F shown in FIG. 2. For simplicity purposes, only FinFET active regions (such as the FinFET active region 210) and the gate regions (such as the main gate region 170 and the back gate regions 150*a* and 150*b*) are shown in FIG. 2. Isolating layers (such as the inter-gate isolating layers 160*a* and 160*b* of FIG. 1F) are omitted in FIG. 2.

With reference to FIG. 2, in one embodiment, each back gate region of the semiconductor structure 200 is shared by (i.e., abuts), is sandwiched between, and runs along two FinFET active regions. For instance, the back gate region 150*a* is shared by and sandwiched between the FinFET active regions 210 and 120*a*. The phrase "runs along" means that the back gate region is shared by at least two devices that reside in the same FinFET active region. For instance, the back gate region 150*a* is shared by at least two transistors M4 and M7 which both reside in the same FinFET active region 120*a*. In other words, the back gate region 150*a* runs along the FinFET active region 120*a*. Similarly, the back gate region 150*a* is also shared by at least two transistors M8 and M9 which both reside in the same FinFET active region 210. In other words, the back gate region 150*a* runs along the FinFET active region 210.

In one embodiment, two FinFET active regions sharing the same back gate region have transistors of the same channel type. In other words, both of the two FinFET active regions have only either n-channel transistors or p-channel transistors (but not both). For example, both the FinFET active regions 210 and 120*a* may have only n-channel (n type) transistors.

In one embodiment, each main gate region of the semiconductor structure 200 crosses over at least two FinFET active regions and forms devices (i.e., transistors) with them.

For instance, the main gate region 276 crosses over at least two FinFET active regions 210 and 120*a* and forms with them the transistors M8 and M4, respectively. Similarly, the main gate region 170 crosses over two FinFET active regions 120*a* and 120*b* and forms with them the transistors M1 and M2, respectively.

In one embodiment, the semiconductor structure 200 can comprise multiple SRAM (Static Random Access Memory) memory cells. For instance, the transistors M1, M2, M3, M4, M5, and M6 residing in four FinFET active regions 120*a*, 120*b*, 212, and 214 and abutting (i.e., sharing) three back gate regions 150*a*, 150*b*, and 150*c* can be electrically coupled together so as to form an SRAM memory cell 270. In general, one or more transistors of an SRAM memory cell can reside in one active region and share one back gate region. Also, it should be noted that the configuration layout of the SRAM memory cell 270 is just one example of an SRAM memory cell layout. Moreover, 6-transistor SRAM cells are only one type of SRAM cells. In general, an SRAM cell can have any number of transistors (e.g., three, eight, twelve, etc.) Regardless of its number of transistors, an SRAM cell can have many options for different layout and use of shared back gate regions.

In summary, with each back gate region running along (i.e., in parallel) and being shared by two FinFET active regions, each of which has multiple main gates crossing over in perpendicular directions, chip area is effectively used while Vt of the devices can be controlled using the back gate regions. Moreover, the fin-shaped active regions further save chip area. In other words, the present invention uses the FinFET technology with shared back gates to achieve the advantages of back gates while maintaining good device density and reasonable costs.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A semiconductor structure, comprising:
   (a) a semiconductor substrate; and
   (b) N substructures on the substrate, N being a positive integer, each of the N substructures comprising:
      (i) first and second FinFET active regions, wherein the first FinFET active region includes at least first and second devices, and
      (ii) a back gate region abutting and being sandwiched between the first and second FinFET active regions, wherein the back gate region is shared by the first and second devices.

2. The semiconductor structure of claim 1, wherein the second FinFET active region includes at least third and fourth devices, and wherein the back gate region is shared by the third and fourth devices.

3. The semiconductor structure of claim 2, further comprising a first main gate region shared by the first and third devices.

4. The semiconductor structure of claim 3, further comprising a second main gate region shared by the second and fourth devices.

5. The semiconductor structure of claim 1, wherein the first and second FinFET active regions comprise semiconductor devices of a same channel type.

6. The semiconductor structure of claim 1, wherein the N substructures comprise M SRAM memory cells, M being a positive integer.

7. The semiconductor structure of claim 1, wherein the N substructures comprise M logic circuits, M being a positive integer.

8. The semiconductor structure of claim 1, wherein N>1.

* * * * *